(12) United States Patent
Wells et al.

(10) Patent No.: US 7,236,745 B2
(45) Date of Patent: Jun. 26, 2007

(54) TRANSCEIVER POWER DETECTION ARCHITECTURE

(75) Inventors: Jonathan Andrew Wells, Pleasanton, CA (US); Louis Arthur Salinas, Pleasanton, CA (US); Paul Alan Kennard, Pleasanton, CA (US)

(73) Assignee: Harris Stratex Networks Operating Corporation, Morrisville, NC (US)

( * ) Notice: Subject to any disclaimer, the term of this patent is extended or adjusted under 35 U.S.C. 154(b) by 228 days.

(21) Appl. No.: 10/382,420

(22) Filed: Mar. 5, 2003

(65) Prior Publication Data

US 2004/0176044 A1 Sep. 9, 2004

(51) Int. Cl.
*H04B 17/00* (2006.01)
*H04B 7/00* (2006.01)

(52) U.S. Cl. .............. 455/67.11; 455/69; 455/127.1; 455/522; 455/115.1

(58) Field of Classification Search ............ 455/67.11, 455/69, 115.1, 115.2, 115.3, 115.4, 126, 127.1, 455/128, 522
See application file for complete search history.

(56) References Cited

U.S. PATENT DOCUMENTS

| | | | |
|---|---|---|---|
| 4,019,150 A * | 4/1977 | Lurey et al. ................ 455/117 |
| 4,983,981 A * | 1/1991 | Feldman .................... 342/372 |
| 5,081,713 A | 1/1992 | Miyazaki .................... 455/76 |
| 5,113,416 A | 5/1992 | Lindell ....................... 375/97 |
| 5,126,686 A | 6/1992 | Tam | |
| 5,126,688 A | 6/1992 | Nakanishi et al. | |
| 5,208,550 A | 5/1993 | Iwane | |
| 5,214,393 A | 5/1993 | Aihara | |
| 5,335,369 A * | 8/1994 | Aisaka ....................... 455/116 |
| 5,371,473 A | 12/1994 | Trinh et al. | |
| 5,515,008 A | 5/1996 | Ueda et al. | |
| 5,640,691 A | 6/1997 | Davis et al. | |
| 5,832,373 A | 11/1998 | Nakanishi et al. | |
| 6,002,922 A | 12/1999 | Schwent | |
| 6,038,432 A | 3/2000 | Onoda | |
| 6,121,925 A * | 9/2000 | Hilliard ..................... 342/432 |
| 6,128,477 A | 10/2000 | Freed | |
| 6,320,913 B1 | 11/2001 | Nakayama | |
| 6,397,090 B1 | 5/2002 | Cho | |
| 6,615,028 B1 | 9/2003 | Loke et al. | |
| 6,678,506 B1 | 1/2004 | Dolman et al. | |
| 6,819,938 B2 * | 11/2004 | Sahota ....................... 455/522 |

OTHER PUBLICATIONS

International Search Report for PCT/US04/05370, Sep. 23, 2004.

* cited by examiner

*Primary Examiner*—Matthew Anderson
*Assistant Examiner*—Eugene Yun
(74) *Attorney, Agent, or Firm*—Leah Sherry; Thelen Reid Brown Raysman & Steiner LLP

(57) ABSTRACT

A detector module is described wherein the detector module includes a housing with a conductive waveguide, a detector, a temperature sensor, and detector circuitry. The waveguide is made of a conductive material and of an appropriate size for a signal of a particular frequency. The detector, which can be a detector diode, protrudes a distance into the waveguide so as to produce a detector signal. The temperature sensor generates a temperature signal responsive to a temperature. The detector circuitry is contained within the housing. Moreover, the detector circuitry is configured to receive and condition the detector signal into a detector module signal. The detector module signal and temperature signal are then associated with a previously calibrated power level. With calibrated power level information, an input signal to a transmitter can be attenuated or amplified to control its output power.

34 Claims, 3 Drawing Sheets

TRANSCEIVER POWER DETECTION ARCHITECTURE

FIELD

The present invention relates generally to the field of electronic communications. More particularly, the present invention relates to the power measurement and control of a signal transmitted over a medium.

BACKGROUND

Communication by means of electromagnetic waves has progressed dramatically since Gulielmo Marconi's demonstration in 1897 of the ability to provide communication with ships sailing the English Channel. From this demonstration sprang many applications including radio, television, and personal communication. Indeed, it is expected that developments in communications will continue.

In developing a communications system, it is generally advantageous for a communications link to utilize the strongest signal feasible for improving signal quality and for providing sufficient coverage or range. With regard to signal quality, a stronger signal yields a higher signal-to-noise ratio. Also, a stronger signal propagates a longer distance. Importantly, signal power must be constrained within limits. For example, in most situations, limits are imposed by governmental agencies such as the Federal Communications Commission (FCC). Indeed, this is important so as to prevent one or more powerful signals from interfering with the communications of other signals in the same frequency range. Other restrictions may be imposed by standards committees or may be self-imposed by a system in order to minimize interference where several signals are expected to simultaneously exist.

An important consideration in designing a communication system is its performance over a wide temperature range because it has been observed that the characteristics of a communication system change over temperature in such a way that its transmission power is affected. For example, while maintaining all other conditions constant, a communication system can transmit at a lower power levels at elevated temperatures and it can transmit at a higher power levels at very cold temperatures, and vice-versa. Whatever the characteristics of a communications system may be, it is nonetheless desirable to closely monitor and control the transmission power. For example, it is desirable to control the maximum allowed power level. It is therefore important to know a communication systems transmission power level at any temperature of operation. Conventional approaches have been placing a power detector within the communication system along with a temperature sensor so as to develop a calibration table. In conventional calibration methods, the entire communication system used to be exercised at various temperatures while noting the output of the detector circuit. When placed in service, the communication system would then retrieve calibration data at a measured temperature so as to accurately measure the system's transmission power. Such conventional calibration methods, however, necessarily required that the entire system, or at least a large part of the system, be placed in a temperature chamber. Because of the sizes and masses involved, the calibration system is slow. Moreover, because an entire system is calibrated, any changes in components, such as upon a failure, required re-calibration.

SUMMARY

The present invention provides advantages over conventional methods by providing accurate measurements of a communication system's transmission power over a wide temperature range, while simplifying the calibration process and by further avoiding any re-calibration upon component replacement.

In one embodiment of the invention, a detector module is positioned in a transmission path between a transmitter and an antenna immediately before the antenna for direct monitoring of the output (transmitted) signal power substantially at the antenna. Moreover, the detector module is configured to produce a detector signal relative to the power level of the output power level of the transmitter. The detector signal is a signal from a properly biased detector diode. In connection with a temperature sensor positioned near the detector module, an association is made between the detector signal and temperature signal with a previously calibrated power level. With calibrated power level information, an input signal to the transmitter can be attenuated or amplified to control its output power.

In another embodiment of the invention, a detector module is described wherein the detector module includes a housing with a conductive waveguide, a detector, a temperature sensor, and detector circuitry. The waveguide is made of a conductive material and it is constructed in an appropriate size for a signal of a particular frequency and power. The detector, which in this instance is a detector diode, is connected to a probe that protrudes a distance into the waveguide so as to produce a detector signal. The temperature sensor generates a signal relative to a temperature. The detector circuitry is contained within the housing. Moreover, the detector circuitry is configured to receive and condition the detector signal into a detector module signal. The detector module signal and temperature signal are then associated with a previously calibrated power level. Here again, with calibrated power level information, an input signal to a transmitter can be attenuated or amplified to control its output power.

These and other variations will be further understood upon an understanding of the present disclosure.

BRIEF DESCRIPTION OF THE DRAWINGS

The accompanying drawings, which are incorporated in and form a part of this specification, illustrate embodiments and, together with the description, serve to explain the principles of the present disclosure.

DETAILED DESCRIPTION

The present invention provides a new transceiver power detection architecture. The new architecture calls for placement of a detector module at or near the transceiver output/input (e.g., near the antenna). In one instance, a power detector module with a small associated thermal mass is advantageously placed near a transceiver's output, such as an antenna, so as to provide accurate measurements of the transceiver's output power. Moreover, the power detector module is calibrated over a wide range of temperatures such that a power detector module reading at a particular temperature can be accurately associated with a calibrated output power. In response to an accurate measurement of the output power, an input signal of the transceiver can be attenuated or amplified, so as to closely control its output power. In the discussion to follow attenuation or amplification will generally be referred to as amplification where it is understood that amplification can be a gain greater than 1 (i.e., $A \geq 1$) and attenuation can be amplification with a gain less than 1 (i.e., $A \leq 1$); moreover, buffering is achieved with a gain equal to 1 (i.e., $A=1$). Where amplification is mentioned, attenuation is also appropriate, and vice-versa. Although the discussion focuses for the most part on the transmitter portion, the power measurement at this physical location applies also to the input of the receiver portion of such transceiver.

In the description to follow, certain aspects of the present invention are described in detail, however, so as not to detract from the teachings of the present invention with unnecessary detail, certain aspects have been simplified in the discussion. Nevertheless, because the present invention finds general application in many systems, these simplifications do not imply narrow applicability.

Figure 1:
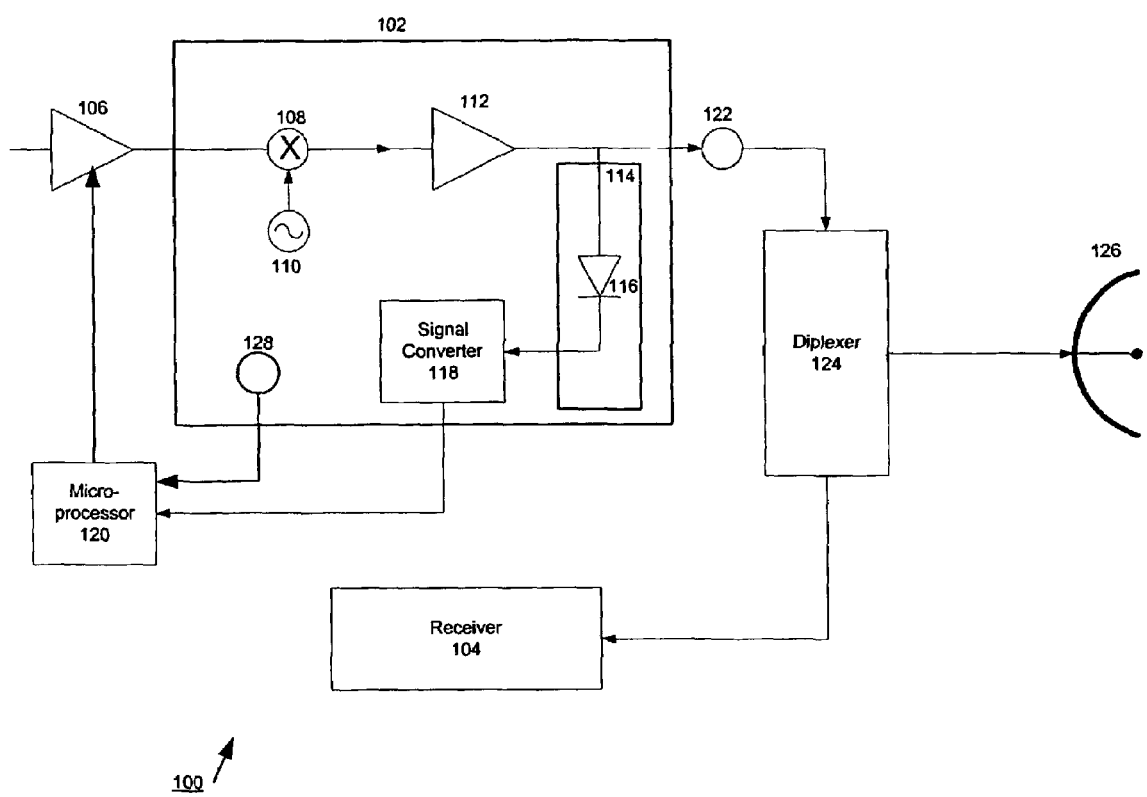
FIG. 1 is a block diagram of a traditional approach to measuring the output power of a communication system.

As noted, the present invention addresses issues surrounding control of the output power of a radio transmitter (and monitoring of input power at the input of the receiver). Indeed, because of very tight government regulations and because of very sensitive modern communications devices, it is imperative that the output power of a radio transmitter be closely controlled. To better understand the present invention, however, an understanding of traditional approaches provides a useful context. A traditional approach toward measuring and, in turn, controlling transmitter output power is as shown in communication system 100 of the block diagram of FIG. 1. As shown in FIG. 1, communication system 100 comprises a transmitter 102 and receiver 104. Transmitter 102 is generally configured to modulate and condition signals for transmission over a medium (e.g., wireless medium) such as by means of antenna 126. Conversely, receiver 104 is generally configured to demodulate a signal received over a medium such as by means of antenna 126.

With regard to the transmission aspects of communication system 100 as shown in FIG. 1, amplifier 106 is configured to receive an input signal. In certain implementations, amplifier 106 can be a variable attenuator or a variable gain amplifier. In communication system 100, the input signal generally contains information such as digital information in a modulated form (e.g., QAM modulated signal) or analog information with a specified bandwidth. The output of amplifier 106 is, in turn, coupled to mixer 108. In conjunction with synthesizer 110, mixer 108 is used to modulate the input signal to another frequency usually a higher frequency appropriate for a transmission medium being used, such as a radio frequency (RF) for wireless communication. In turn, amplifier 112 amplifies the RF signal to a higher power appropriate for transmission over a medium. Amplifier 112 can be configured in many forms including integrated circuit amplifiers, magnetrons or traveling wave tubes (TWT).

Detector circuit 114, containing detector diode 116, is configured to measure a detected signal level at the output of amplifier 112 within transmitter 102. This detected signal level is used to approximate the output power transmitted from antenna 126. Importantly, transmitter 102 can be a large module with many components and significant thermal mass. Signal converter 118 is provided to condition detected signals for coupling to microprocessor 120 which in turn controls the level of amplification of amplifier 106. Signal converter 118 can include detector biasing and amplification as well as filtering. By varying the amplification of amplifier 106, the signal detected by detector circuit 114 is controlled while also controlling the output power of transmitter 102. Traditional applications of detector circuit 114 have used microstrip proximity couplers for directing a detected signal to detector diode 116.

Signal isolator 122 is provided between amplifier 112 and diplexer 124 to minimize return losses within communication system 100. Note that in certain implementations a circulator is used in place of signal isolator 122. Whichever is used, signal isolation is achieved to provide very closely matched signals. Diplexer 124 allows for dual transmit and receive functions within communication system 100. In certain applications, diplexer 124 is a bandpass filter that separates transmitted and received signals existing within different frequency ranges. Accordingly, an amplified RF signal generated by amplifier 112 is directed through diplexer 124 and is passed to antenna 126 for transmission over a medium, a wireless medium in this example. Conversely, where a signal is received by antenna 126, such received signal is directed through diplexer 124 and passed to receiver 104. Because details of receiver 104 are not necessary to understand the present invention, receiver 104 will not be further described.

The traditional approach of FIG. 1 can further be understood as a control system problem wherein the output power of a signal exiting antenna 126 is desired to be controlled by an input signal to amplifier 106. For proper control of communication system 100, observability and controllability issues must be considered. As described, the output power of a signal exiting antenna 126 is observable through monitoring of the power of a signal that exists at detector circuit 114. However, there are intervening complications. Here we note that the output power is not observed directly, but rather in a detached and indirect way. As shown, isolator 122 and diplexer 124, with all their real-world complexities, reside between the desired signal to be observed (the output power) and the signal actually measured (the signal at detector circuit 114). Thus, the signal observed at detector circuit 114 is not a true observation of the output signal from antenna 126 such that it is necessary to account for the characteristics of more than just detector circuit 114 at various temperatures and frequencies over time. For example, as described, traditional approaches characterize the entire communication system 100 or at least transmitter 102 over a temperature range.

In controlling the output power of a communication system, it is further important to consider the affects of temperature where communication system 100, including transmitter 102, may be exposed to wide temperature ranges. Components of communication system 100 and in particular transmitter 104, signal isolator 122, and diplexer 124 can exhibit performance changes as a function of temperature. For example, transmitter circuitry such as that contained within mixer 108, synthesizer 110 and amplifier 112 may vary in unknown or unpredictable ways as a function of temperature. This is further exacerbated by the fact that detector circuit 114 (including detector diode 116) and signal converter 118 also experience changes as a function of temperature.

In order to account for changes over temperature, traditional approaches have performed temperature calibration of communication system 100 or at least transmitter 102 by enclosing them in a temperature chamber and obtaining calibration data by precisely measuring an output power level from antenna 126 at specified temperatures. In this way calibration data over a known temperature range has been associated with a transmitted output power. In operation, temperature sensor 128 would provide a temperature signal to microprocessor 120. Temperature sensor 128 is implemented in many forms including a temperature sensing diode or resistor. Microprocessor 120, through the use of calibration data provided in a lookup table, for example, would then convert a received detector signal to a calibrated power level. An appropriate signal would then be directed by microprocessor 120 to amplifier 106 which will control the output power to communication system 100 in a known way.

As described, the traditional approach to calibrating a communication system requires that the entire communication system or at least transmitter 102 be placed within a temperature chamber for calibration. Because of the thermal mass associated with even just transmitter 102, temperature calibration was a lengthy process wherein it was necessary that components be left at a particular temperature for an extended period of time so as to assure that all the components were at the specified temperature. In obtaining calibration data with fine resolution over a wide temperature range, the time and cost of calibration increases dramatically. Moreover, because communication system 100 or at least 102 can be large, a temperature chamber is limited in the number of units it can calibrate at a time.

Figure 2:
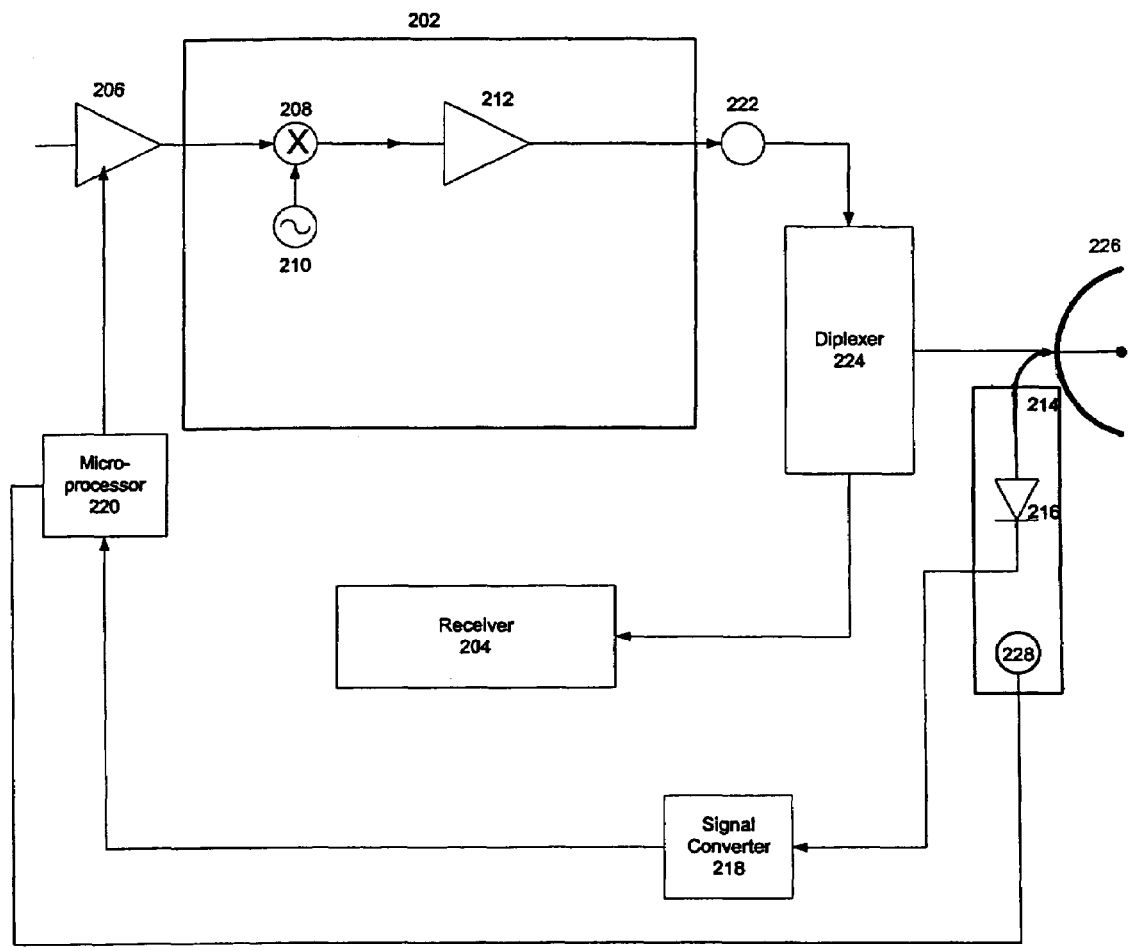
FIG. 2 is a block diagram of a new approach to measuring the output power of a communication system.

With this understanding of traditional methods of calibrating communication systems, the present invention can be better appreciated. With reference to FIG. 2, similarities to FIG. 1, exist including receiver 204, diplexer 224 and antenna 226. The present invention, however, differs significantly from prior art by its placement of detector module 214 that includes detector diode 216, signal converter 218, and temperature sensor 228. In a preferred embodiment, detector module 214 is placed on a substrate that further includes a waveguide coupled between the path from diplexer 224 to antenna 226. Other types of couplings for detecting a power level are also appropriate. The position of detector module 214 close to antenna 226 allows any variations in the transmitter path (e.g., transmitter components, isolator, circulator, or diplexer filter) not to degrade the calibrated power accuracy of the detector as the transmitter path varies over frequency, power, or time. In addition, the physically smaller detector module 214 allows for faster thermal cycling, improving calibration time and easing manufacturability of communications system 200.

In seeking to obtain accurate measurements of the output power of communication system 200 over a temperature range, the present invention does not require placing a large thermal mass, such as that of communication system 200 or transmitter 202, in a temperature chamber. Advantageously, it is noted that with the placement of detector module 214 near the output of communication system 200, it is not necessary to calibrate the operation of the entire system as in the prior art. Rather it is only necessary to calibrate detector module 214 with its associated smaller thermal mass. Indeed, it is not important that the characteristics of transmitter 102, isolator 222 or diplexer 224 change; and, all that matters is that the power level of the output signal be known. This can be measured by passing a signal of known power level through detector module 214 over a temperature range.

The present invention, as shown in FIG. 2, can be further understood in terms of a control system problem wherein the output power of a signal exiting antenna 226 is desired to be controlled by an input signal to amplifier 206. As discussed with reference to FIG. 1, observability and controllability issues must be considered. With reference to FIG. 2, however, the output power of a signal exiting antenna 226, which does not vary significantly over temperature, is well observed through monitoring of the power of a signal immediately before antenna 226. Advantageously, with this architecture, there are minimal intervening complications. Here, the output power is observed almost directly instead of the indirect way of a traditional approach of FIG. 1. As shown in FIG. 2, transmitter 202, isolator 222 and diplexer 224, with all their real-world complexities, reside before detector module 214. Thus, the signal observed at detector module 214 is a truer observation of the output signal at antenna 226; and the only accounting needed is an accounting for the characteristics of detector circuit 214 over a temperature range.

It is important to note that the power of the signal measured by detector circuit 214 also includes a contribution from a signal received by antenna 226. This received signal, however, is many orders of magnitude lower than the transmitted signal such that any error introduced by this signal is insignificant. For example, where communication system 200 may be transmitting at 30 dBm, it may be receiving at −60 dBm which is many orders of magnitude lower. It is further important to note that in a preferred embodiment, antenna 226 is closely matched to the rest of the system such that return losses are very low and, in turn, do not contribute in a significant amount to the measurement of detector circuit 214.

In light of the aforementioned complications of traditional calibration methods, it is therefore notable that, for calibration, the present invention requires placement in a temperature chamber only of the detector circuit. This way, a plurality of detector circuits can be calibrated within a temperature chamber at once. Moreover, because detector circuit 214 has a smaller thermal mass than communication system 200 or transmitter 202, detector circuit 214 can reach a desired temperature much quicker, thereby decreasing calibration time and improving manufacturability while reducing associated costs.

In a calibration process, detector circuit 214 is tested at various temperatures by passing a signal of known frequency and power level through detector circuit 214 and measuring the output of signal converter 218. In this way, a lookup table is generated that associates signal levels from detector circuit 214 to known signal power levels. After calibration, such a lookup table can then be stored in microprocessor 220 or an appropriate memory (not shown). In operation, communication system 200 and its various components including detector circuit 214 may operate over a wide range of temperatures. At a given temperature, however, as measured by temperature sensor 228 within detector circuit 214, the power level of a signal passing from diplexer 224 to antenna 226 is determined by the microprocessor 220 through the use of the lookup table. In turn, microprocessor 220 directs a signal to amplifier 206 to appropriately amplify the input signal level which then affects the output power level and the power level measured by detector circuit 214. In this way, a feedback loop is provided through which the output power level of communication system 200 is closely controlled by knowing, in a calibrated way, the characteristics only of detector circuit 214.

Figure 3:
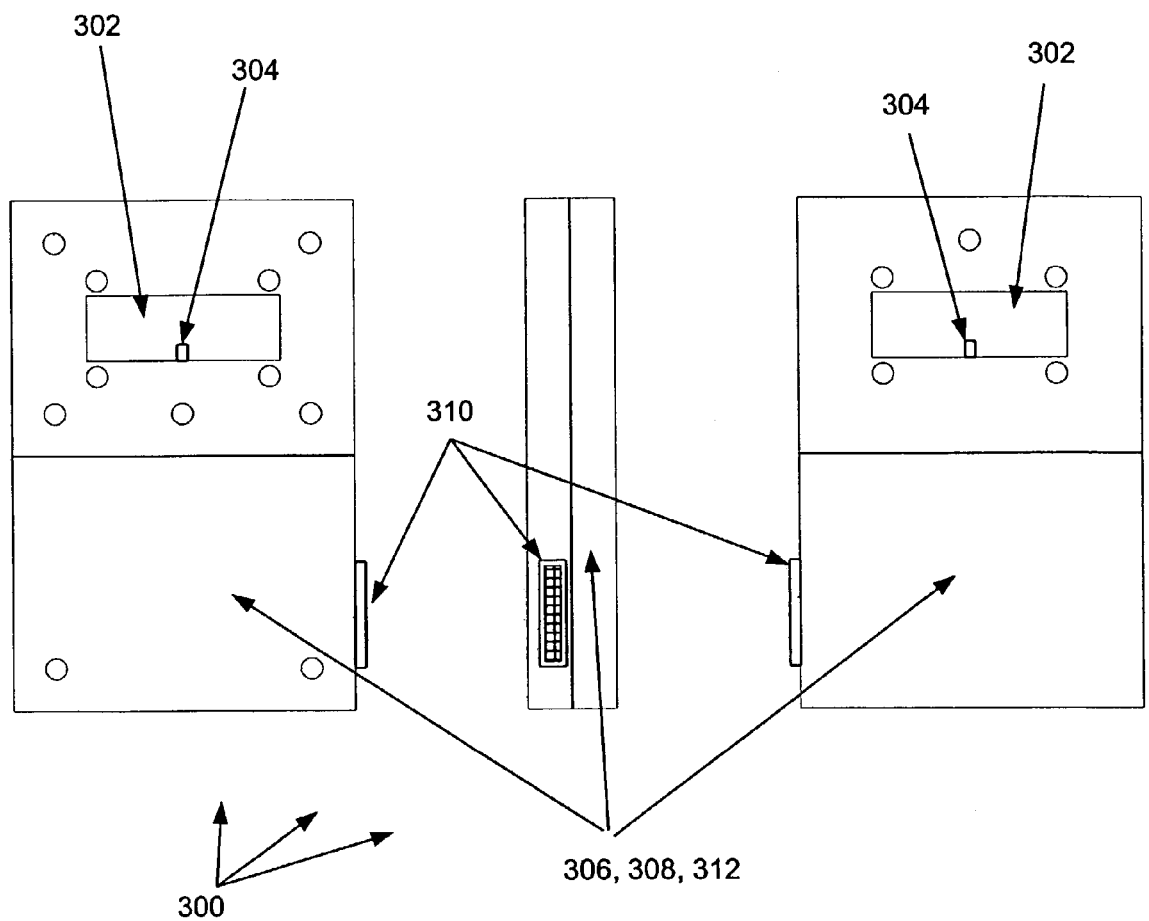
FIG. 3 is a mechanical drawing of a front, side and rear view of a detector module according to an embodiment of the present invention.

Shown in FIG. 3 is a mechanical drawing with front, side, and rear perspectives of a detector module 300 according to the present invention. The dimensions of waveguide 302 are provided as appropriate for signals of the required frequency. Waveguide 302 is preferably made of conductive material. Detector diode 304 is coupled to a probe that is positioned to protrude into the waveguide 302 opening. Detector diode 304 is further coupled to detector circuitry 306, signal converter circuitry 308, and temperature sensor 312 which are contained within detector module 300. Although waveguide 302 is made of a conductive material, detector module 300 need not be a conductive material. Connector 310 provides an interface between the circuitry contained within detector module 300 and other components of a communication system such as a microprocessor or a transmitter (not shown). From FIG. 3, it can therefore be appreciated that the small size of detector module 300 facilitates calibration within a temperature chamber.

While various embodiments and advantages have been described, it will be recognized that a number of variations will be readily apparent. For example, in implementing equivalence classes, designs can be scaled to implement networks of many sizes. Thus, the present teachings may be widely applied consistent with the foregoing disclosure and the claims which follow.

What is claimed is:

1. A communication signal power detection architecture, comprising:
   a transmitter for modulating an outgoing signal;
   an antenna;
   a diplexer coupled between the transmitter and the antenna;
   a detector coupled between the diplexer and the antenna for generating a detector signal to represent signal power of at least the outgoing signal substantially at the antenna; and
   a temperature sensor positioned substantially at the detector, wherein the signal power substantially at the antenna is controllable in response to the detector signal, the temperature at the detector and predetermined temperature characteristics of the detector, wherein the predetermined temperature characteristics are predetermined from testing the detector without the thermal mass of the transmitter in a calibration chamber.

2. The architecture of claim 1, further comprising a waveguide with an opening for the detector.

3. The architecture of claim 1, wherein the detector includes a detector diode and a biasing circuit.

4. The architecture of claim 1, wherein the temperature sensor includes a temperature sensitive device having a resistor or a diode.

5. The method of claim 1, further comprising a receiver coupled to the diplexer.

6. A communication system, comprising:
   a radio transmitter configured to provide an output signal having a power level;
   an antenna configured to transmit the output signal over a medium;
   a diplexer coupled between the radio transmitter and the antenna;
   a detector coupled between the diplexer and the antenna, substantially at the antenna, for generating a detector signal to represent the power level of at least the output signal substantially at the antenna;
   a temperature sensor positioned substantially near the detector to produce a temperature signal responsive to a temperature substantially near the detector; and
   a control module having inputs for receiving the detector signal and the temperature signal and being configured for associating the detector signal and temperature signal with a calibrated power level and for causing amplification of the output signal according to the calibrated power level, wherein the association of the detector and temperature signals and with the calibrated power level is predetermined from testing the detector without the thermal mass of the transmitter in a calibration chamber.

7. The system of claim 6, wherein the amplification of the output signal uses a gain lower than, equal to, or higher than 1.

8. The system of claim 6, wherein the control module is further configured to generate an analog signal used for the amplification of the output signal.

9. The system of claim 6, wherein the control module is further configured to generate a digital signal used for the amplification of the output signal.

10. The system of claim 6, wherein the control module includes a microprocessor configured for associating the detector signal and the temperature signal.

11. The system of claim 6, wherein the control module includes a memory.

12. The system of claim 11, wherein the memory includes a lookup table that contains an association of detector signals and temperature signals with calibrated power levels.

13. The system of claim 6, further comprising a receiver and wherein the diplexer is configured to isolate the output signal and a signal received via the antenna and to direct the received signal to the receiver.

14. The system of claim 13, wherein the received signal has a power level substantially lower than the power level of the output signal.

15. The system of claim 6, wherein a power level of a return loss signal from the antenna is substantially lower than the power level of the output signal.

16. The system of claim 6, wherein the detector includes a detector diode.

17. The system of claim 6, wherein the detector includes a detector diode and a biasing circuit.

18. The method of claim 6, further comprising a receiver coupled to the diplexer.

19. A module in a communication system, comprising:
   a transmitter;
   an antenna;
   a diplexer coupled between the transmitter and the antenna;
   a housing positioned between the diplexer and the antenna, the housing including a waveguide made of a conductive material and configured to pass a transmitted signal having a power level, the housing being placed substantially at the antenna;
   a detector protruding into the waveguide and configured to produce a detector signal to represent signal level of at least the transmitted signal substantially at the antenna;
   a temperature sensor positioned within the housing and configured to produce a temperature signal substantially near the detector; and
   detector circuitry positioned within the housing and configured to receive the detector signal, wherein the detector signal and the temperature signal correspond to a calibrated power level that represents the power level of the transmitted signal detected substantially at the antenna, wherein the correspondence between the detector and temperature signals and the calibrated power level is predetermined from testing the detector without the thermal mass of the transmitter in a calibration chamber.

20. The module of claim 19, further having a control module wherein the detector signal and the temperature signal are coupled to the control module to control amplification of the power level of the transmitted signal.

21. The module of claim 20, wherein the amplification of the output signal uses a gain greater than, equal to or lower than 1.

22. The module of claim 20, wherein the control module includes a microprocessor that associates the detector signal and temperature signal with the calibrated power level.

23. The module of claim 20, wherein the control module includes a memory for storing an association of detector signals and temperature signals with calibrated power levels.

24. The module of claim 20, wherein the control module includes a lookup table for storing an association of detector signals and temperature signals with calibrated power levels.

25. The module of claim 20, wherein a signal passed in a direction opposite to that of a direction of the transmitted signal has a power level substantially lower than the power level of the transmitted signal.

26. The module of claim 20, wherein the detector includes a detector diode.

27. The detector module of claim 20, wherein the detector includes a detector diode and a biasing circuit.

28. The method of claim 19, further comprising a receiver coupled to the diplexer.

29. A method for controlling the power level of a signal transmission from a communication system with a transmitter, an antenna, and a diplexer coupled between the transmitter and the antenna, comprising:

measuring a signal power level of at least a transmitted signal substantially at the antenna by a detector coupled between the diplexer and the antenna;

producing a detector signal responsive to the signal power level being measured;

measuring a temperature level;

associating the detector signal and the temperature level with a calibrated signal power level, wherein the association of the detector signal and temperature level with the calibrated power level is predetermined from testing the detector without the thermal mass of the transmitter in a calibration chamber; and causing amplification responsive to the calibrated signal power level with the signal power level of the transmitted signal being controlled thereby.

30. The method of claim 29, wherein the amplification of the transmitted signal uses a gain lower than, equal to or greater than 1.

31. The method of claim 29, further comprising storing an association of detector signals and temperature signals with calibrated signal power levels.

32. The method of claim 29, further comprising storing a lookup table of an association of detector signals and temperature signals with calibrated signal power levels.

33. The method of claim 29, wherein the detector signal is a detector diode signal associated with a detector diode.

34. The method of claim 33, further comprising biasing the detector diode.

* * * * *

UNITED STATES PATENT AND TRADEMARK OFFICE
CERTIFICATE OF CORRECTION

| | | |
|---|---|---|
| PATENT NO. | : 7,236,745 B2 | Page 1 of 1 |
| APPLICATION NO. | : 10/382420 | |
| DATED | : June 26, 2007 | |
| INVENTOR(S) | : Jonathan Andrew Wells, Louis Arthur Salinas and Paul Alan Kennard | |

It is certified that error appears in the above-identified patent and that said Letters Patent is hereby corrected as shown below:

Col. 7, Line 36, Claim 1, line 14, following "detector" insert --,-- (a comma).

Col. 7, Line 43, Claim 2, line 2, following "waveguide" delete "with an opening for the detetor".

Col. 7, Line 49, Claim 5, line 1, delete "method" and in place thereof insert --architecture--.

Col. 8, Line 4, Claim 6, line 21, following "temperature signals" delete "and".

Col. 8, Line 39, Claim 18, line 1, delete "method" and in place thereof insert --system--.

Col. 9, Line 25, Claim 28, line 1, delete "method" and in place thereof insert --module--.

Signed and Sealed this

Twenty-eighth Day of August, 2007

JON W. DUDAS
*Director of the United States Patent and Trademark Office*